United States Patent
Kim et al.

(10) Patent No.: US 8,617,952 B2
(45) Date of Patent: Dec. 31, 2013

(54) VERTICAL TRANSISTOR WITH HARDENING IMPLATATION

(75) Inventors: Young Pil Kim, Eden Prairie, MN (US); Hyung-Kew Lee, Edina, MN (US); Peter Nicholas Manos, Eden Prairie, MN (US); Chulmin Jung, Eden Prairie, MN (US); Maroun Georges Khoury, Burnsville, MN (US); Dadi Setiadi, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 245 days.

(21) Appl. No.: 12/891,966

(22) Filed: Sep. 28, 2010

(65) Prior Publication Data

US 2012/0074488 A1    Mar. 29, 2012

(51) Int. Cl.
*H01L 21/336* (2006.01)

(52) U.S. Cl.
USPC ....... 438/268; 257/302; 257/329; 257/E21.41

(58) Field of Classification Search
USPC ..................... 438/268; 257/E21.41
See application file for complete search history.

(56) References Cited

U.S. PATENT DOCUMENTS

| | | | |
|---|---|---|---|
| 4,232,057 A | 11/1980 | Ray | |
| 4,323,589 A | 4/1982 | Ray | |
| 4,576,829 A | 3/1986 | Kaganowicz | |
| 5,330,935 A | 7/1994 | Dobuzinsky | |
| 5,412,246 A | 5/1995 | Dobuzinsky | |
| 5,443,863 A | 8/1995 | Neely | |
| 5,612,559 A * | 3/1997 | Park et al. | 257/302 |
| 5,872,052 A | 2/1999 | Iyer | |
| 5,913,149 A | 6/1999 | Thakur | |
| 5,923,948 A | 7/1999 | Cathey, Jr. | |
| 5,929,477 A | 7/1999 | McAllister | |
| 6,013,548 A | 1/2000 | Burns | |
| 6,034,389 A | 3/2000 | Burns | |
| 6,077,745 A | 6/2000 | Burns | |
| 6,100,166 A | 8/2000 | Sakaguchi | |
| 6,165,834 A | 12/2000 | Agarwal | |
| 6,346,477 B1 | 2/2002 | Kaloyeros | |
| 6,376,332 B1 | 4/2002 | Yanagita | |
| 6,534,382 B1 | 3/2003 | Sakaguchi | |
| 7,052,941 B2 | 5/2006 | Lee | |
| 7,190,616 B2 | 3/2007 | Forbes | |
| 7,247,570 B2 | 7/2007 | Thomas | |
| 7,273,638 B2 | 9/2007 | Belyansky | |
| 7,285,812 B2 | 10/2007 | Tang | |
| 7,378,702 B2 | 5/2008 | Lee | |
| 7,381,595 B2 | 6/2008 | Joshi | |
| 7,413,480 B2 | 8/2008 | Thomas | |

(Continued)

OTHER PUBLICATIONS

Takato et al., High Performance CMOS Surrounding Gate Transistor (SGT) for Ultra High Density LSIs, Downloaded on Apr. 14, 2009 from IEEE Xplore, pp. 222-225.

*Primary Examiner* — Hsin-Yi Hsieh
(74) *Attorney, Agent, or Firm* — Mueting Raasch & Gebhardt

(57) ABSTRACT

A method includes providing a semiconductor wafer having a plurality of pillar structures extending orthogonally from the semiconductor wafer. Each pillar structure forms a vertical pillar transistor having a top surface and a side surface orthogonal to the top surface. Then a hardening species is implanted into the vertical pillar transistor top surface. Then the vertical pillar transistor side surface is oxidized to form a side surface oxide layer. The side surface oxide layer is removed to form vertical pillar transistor having rounded side surfaces.

10 Claims, 12 Drawing Sheets

(56) References Cited

U.S. PATENT DOCUMENTS

| | | |
|---|---|---|
| 7,470,142 B2 | 12/2008 | Lee |
| 7,470,598 B2 | 12/2008 | Lee |
| 2002/0081822 A1 | 6/2002 | Yanagita |
| 2004/0262635 A1* | 12/2004 | Lee .............................. 257/199 |
| 2005/0092526 A1 | 5/2005 | Fielder |
| 2005/0218521 A1 | 10/2005 | Lee |
| 2005/0280042 A1 | 12/2005 | Lee |
| 2005/0280061 A1 | 12/2005 | Lee |
| 2005/0280154 A1 | 12/2005 | Lee |
| 2005/0280156 A1 | 12/2005 | Lee |
| 2005/0282356 A1 | 12/2005 | Lee |
| 2006/0275962 A1 | 12/2006 | Lee |
| 2007/0077694 A1 | 4/2007 | Lee |
| 2007/0281439 A1 | 12/2007 | Bedell |
| 2008/0032463 A1 | 2/2008 | Lee |
| 2008/0038902 A1 | 2/2008 | Lee |
| 2008/0048327 A1 | 2/2008 | Lee |
| 2008/0191312 A1 | 8/2008 | Oh |
| 2008/0261380 A1 | 10/2008 | Lee |
| 2008/0265360 A1 | 10/2008 | Lee |
| 2010/0207207 A1* | 8/2010 | Tsai .............................. 257/343 |

* cited by examiner

ATTACH DONOR WAFER (INVERTED) TO ACCEPTOR WAFER

REMOVE BASE LAYER, APPLY PHOTORESIST PATTERN

ETCH DOWN TO METAL LAYER TO FORM PILLARS

APPLY HARD MASK FOR SOURCE LINE PHOTOLITHOGRAPHY

Sacrificial Oxide Formation

Selective Oxide Etch

ALTERNATIVE ORDERING OF MEMORY CELL ELEMENTS

VERTICAL TRANSISTOR WITH HARDENING IMPLATATION

BACKGROUND

Solid state memories (SSMs) provide an efficient mechanism for storing and transferring data in a wide variety of applications, such as hand-held portable electronic devices. Individual memory cells within such memories can be volatile or non-volatile, and can store data by the application of suitable write currents to the cells to store a sequence of bits. The stored bits can be subsequently read during a read access operation by applying suitable read currents and sensing voltage drops across the cells.

Some SSM cell configurations employ a memory element coupled to a channel based switching device such as a metal oxide semiconductor field effect transistor (MOSFET). The switching device provides selective access to the memory element during read and write operations. Examples of memory cells with this type of memory element-switching device arrangement include, but are not limited to, volatile dynamic random access memory (DRAM), non-volatile resistive random access memory (RRAM), and non-volatile spin-torque transfer random access memory (STRAM).

While operable, a limitation with the use of MOSFETs and other types of switching devices in a memory cell is the areal extent (size) of such devices. A horizontal MOSFET layout is often used in which the associated drain and source regions are placed adjacent one another in a base substrate, with the channel region extending horizontally therebetween. The memory element is formed above either the source or the drain.

Horizontal MOSFETs may require a minimum size of about $4F^2$ where F is the minimum feature dimension of the associated manufacturing process (e.g., F=70 nm, etc.). Since this is significantly larger than the areal size of many types of memory elements, the switching device size can be a limiting factor in achieving greater areal densities in a memory array.

Some recent semiconductor memory designs have proposed a stacked memory cell arrangement whereby the memory element and the transistor are vertically aligned as a pillar, or stack, above a base substrate. In a stacked memory cell, the drain and source regions are located one above the other, with the channel region extending vertically therebetween. While advantageously promoting an enhanced areal data density, it can be difficult to form the pillar structure of the vertical transistor so that the transistor can operate optimally.

BRIEF SUMMARY

The present disclosure relates to a vertical transistor that is formed with a hardening implant. In particular the hardening implant step is utilized to form the vertical transistor with improved performance. The hardening implant step allows the side surfaces to be preferentially rounded while maintaining a planar top surface for further processing. The method also includes the formation of a gate oxide layer on the rounded side surfaces of the vertical transistor.

In one particular embodiment, a method includes providing a semiconductor wafer having a plurality of pillar structures extending orthogonally from the semiconductor wafer. Each pillar structure forms a vertical pillar transistor having a top surface and a side surface orthogonal to the top surface. Then a hardening species is implanted into the vertical pillar transistor top surface. Then the vertical pillar transistor side surface is oxidized to form a side surface oxide layer. The side surface oxide layer is removed to form vertical pillar transistor having rounded side surfaces.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
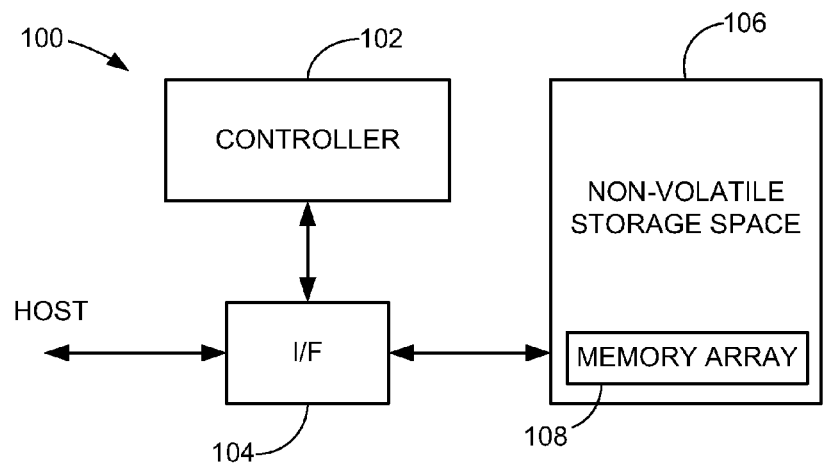
FIG. 1 shows a functional block representation of an exemplary data storage device constructed in accordance with various embodiments of the present invention.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as forming a "coincident interface" with, or being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

The present disclosure relates to a vertical transistor that is formed with a hardening implant. In particular the hardening implant step is utilized to form the vertical transistor with improved performance. The hardening implant step allows the side surfaces to be preferentially rounded while maintaining a planar top surface for further processing. The method also includes the formation of a gate oxide layer on the rounded side surfaces of the vertical transistor. While the present disclosure is not so limited, an appreciation of various aspects of the disclosure will be gained through a discussion of the examples provided below.

The present disclosure is generally directed to an apparatus characterized as a multi-wafer structure with embedded (bottom side) control lines, and an associated method for making the same. The embedded control lines provide electrical interconnection with vertically stacked semiconductor elements within the multi-wafer structure. The stacked semiconductor elements form vertical pillar transistors that can be formed via a hardening implantation step as described below.

In various embodiments, an acceptor wafer is formed that incorporates various control circuitry, and a donor wafer is formed that incorporates a matrix from which individual channel based switching devices (e.g., vertical pillar transistors) are subsequently formed.

The acceptor wafer and the donor wafer are each provided with a metal layer on a respective facing surface. The acceptor and donor wafers are attached to form the multi-wafer structure, and during this attachment process the respective metal layers are brought together to form a single combined metal layer that is embedded within the multi-wafer structure. The combined metal layer is transformed during subsequent processing into individual embedded bottom side control lines (e.g., embedded source lines).

FIG. 1 provides an illustrative device environment in which such processing can be advantageously utilized. In FIG. 1, a data storage device 100 employs semiconductor memory to store data supplied by a host. In some embodiments, the device 100 is characterized as a non-volatile solid state drive (SSD), although such is not limiting. In many embodiments, the device 100 is characterized as a volatile dynamic random access memory (DRAM), non-volatile resistive random access memory (RRAM), and non-volatile spin-torque transfer random access memory (STRAM).

A programmable controller 102 provides top level control of the device 100 during operation. An interface circuit (I/F) 104 communicates with the host and transfers data to be stored in a semiconductor memory 106.

The semiconductor memory 106 is characterized as a non-volatile storage space formed from one or more arrays 108 of non-volatile memory cells (e.g., RRAM or STRAM. In other embodiments, the memory 106 can take the form of a volatile memory space such as a DRAM cache. Additional hierarchical memory storage layers can be provided such as a downstream non-volatile main storage (e.g., a magnetic disc, etc.).

Figure 2:
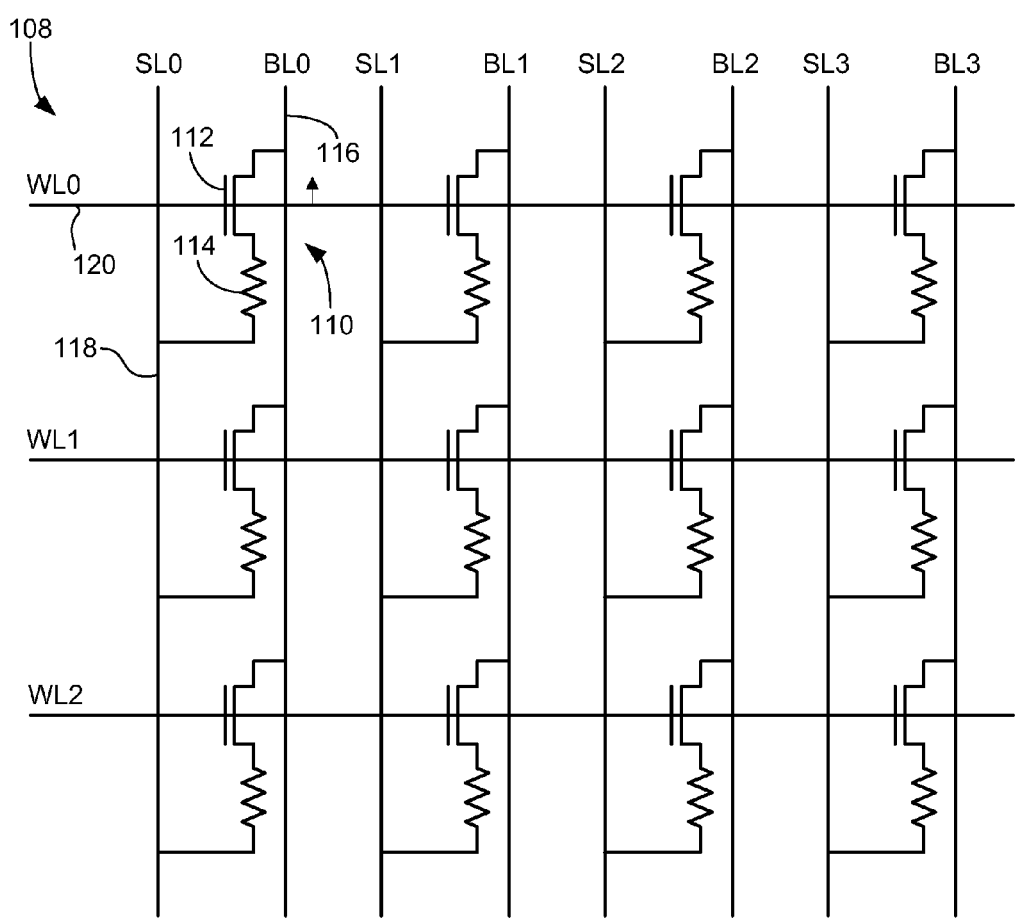
FIG. 2 is a schematic representation of a memory array of the device of FIG. 1.

FIG. 2 is a schematic representation of a portion of the non-volatile array 108 of FIG. 1. The array 108 is formed from a number of memory cells 110 arranged into rows and columns. While only three (3) rows and four (4) columns are shown in FIG. 2, it will be appreciated that any numbers of rows and columns of the cells 110 can be provided.

Each cell 110 in the array 108 includes a switching device 112 connected in series with a resistive memory element 114. In some embodiments, the switching devices 112 are characterized as n-channel MOSFETs (transistors), and the memory elements 114 are programmable resistive sense elements such as but not limited to resistive random access memory (RRAM) elements, spin-torque transfer random access memory (STRAM) elements or programmable metallization cells (PMCs).

A number of bit lines 116 denoted as BL0-BL3 interconnect a first end ("top side") of each of the cells along each column. Source lines 118 denoted as SL0-SL3 interconnect an opposing, second end ("bottom side") of each of the cells along each column. Word lines 120 denoted as WL0-WL2 interconnect the gate regions of the MOSFETs 112 along each row. It will be appreciated that other arrangements and interconnection schemes can be employed, so that the schematic representation of FIG. 2 is merely illustrative and not limiting.

Figure 3:
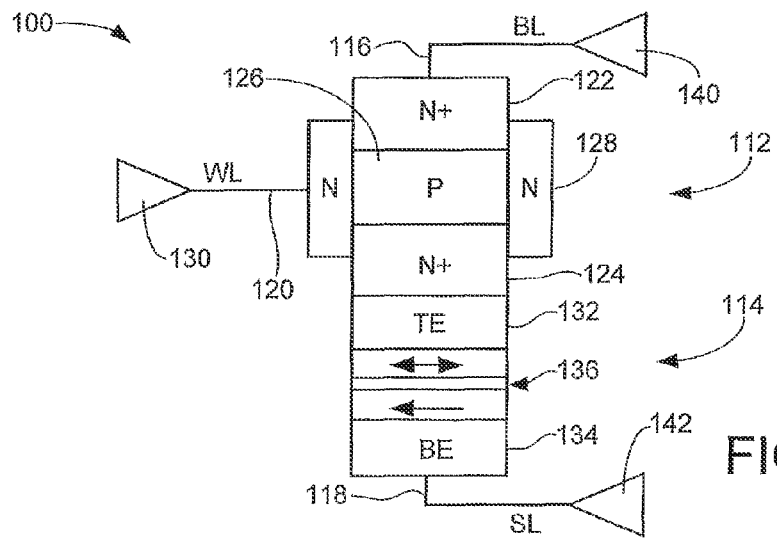
FIG. 3 is a side elevational representation of various semiconductor layers of a vertically stacked memory cell of FIG. 2 in accordance with some embodiments.

FIG. 3 is a layer representation of a selected memory cell 110 from FIG. 2 in accordance with some embodiments. The transistor 112 is formed from respective N+ doped regions 122, 124 separated by a vertically extending P doped channel region 126. An N doped control gate 128 surrounds the channel region 126 (a gate oxide layer, not shown here, separates the N doped control gate 128 from the N+ doped regions 122, 124 and P doped channel region 126). Application of a suitable bias voltage from a word line (WL) driver 130 will place the transistor 112 in a forward biased (conductive) state, allowing currents to pass through the memory cell 110 across the drain-source junction.

The memory element 114 is characterized in FIG. 3 as an RRAM or STRAM element and includes top and bottom electrodes (TE, BE) 132, 134 separated by a magnetic tunnel junction 136. The magnetic tunnel junction 136 includes a magnetic free layer (double arrow layer) and a magnetic pinned layer (single arrow layer) separated by a tunnel barrier layer. The STRAM 136 cell is programmed by passing a spin polarized write current through the STRAM 136 cell in a first or second direction.

To program the memory cell 110 to a desired state, the WL driver 130 will assert the WL 120 and respective SL and BL drivers 140, 142 will direct current through the memory element 114 in the appropriate direction and at the appropriate voltage and current magnitudes. The programmed state of the element 114 can be subsequently read by asserting the WL 120, passing a smaller read bias current through the memory cell 110 such as from SL driver 140 to BL driver 142, and comparing the resulting voltage on the SL 116 to a reference voltage using a separate sense amplifier (not shown).

The stacked nature of the memory cell 110 in FIG. 3 provides a number of advantages. The relatively small areal extent of the memory cell allows arrays such as in FIG. 2 to achieve relatively high areal densities. However, a limitation with stacked memory cells such as set forth in FIG. 3 relates to establishing access to the bottom side of the memory cell; that is, it has been found difficult to establish an electrical interconnection such as that shown in FIG. 3 between the SL driver 142 and the BE 134.

Figure 4A:
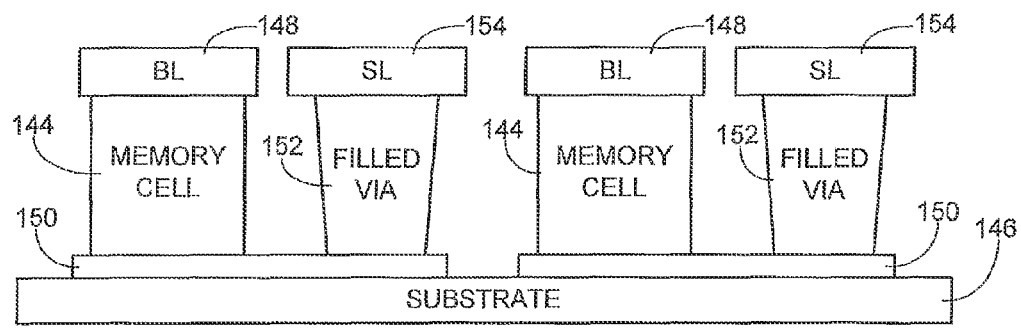
FIGS. 4A-4B show prior art approaches to establishing bottom side interconnection to vertically stacked memory cells such as set forth in FIG. 3.

One prior art solution uses filled via structures such as depicted in FIG. 4A. In this approach, individual stacked memory cells 144 are supported above a base substrate 146, and bit lines 148 are connected to the tops of the memory cells 144. Bottom-side connections can be made using embedded conductive pads 150 and vias 152 that are disposed adjacent the memory cells 144 and filled with a conductive material. Source lines 154 are connected to the top sides of the vias 152, so that the source lines run adjacent the bit lines 148 across the top of the array.

While operable, it can be appreciated that the approach in FIG. 4A reduces areal density of the array due to the additional space required for the filled vias 152. The approach in FIG. 4A may further require enhanced manufacturing complexities and costs to form the vias and the conductive pad interconnections.

Figure 4B:
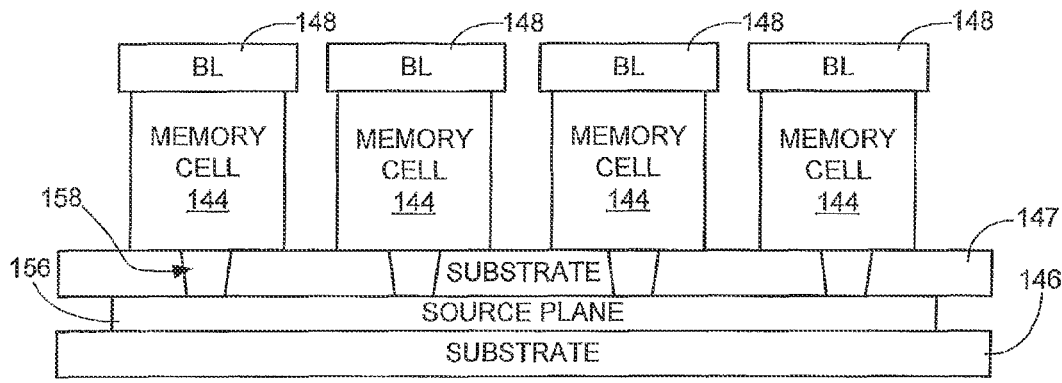

Another prior art solution that has been employed with stacked cells is the use of a common source plane (SP), such as depicted at 156 in FIG. 4B. The source plane 156 extends below the respective stacked memory cells 144 so that all of the memory cells in the array are interconnected to the source plane, such as through vias 158 that extend through an upper oxide substrate 147. As before, individual rows (or columns) of the memory cells are interconnected via separate bit lines 148.

While operable, limitations with FIG. 4B include the enhanced processing and cost to form the metallization of the entire source plane, as well as limitations during operation in that currents generally cannot be passed through two or more cells concurrently in opposing directions. Other prior art solutions include additional interconnection layers and contact layers to accommodate the bottom side interconnections for the stacked memory cells.

Figure 5A:
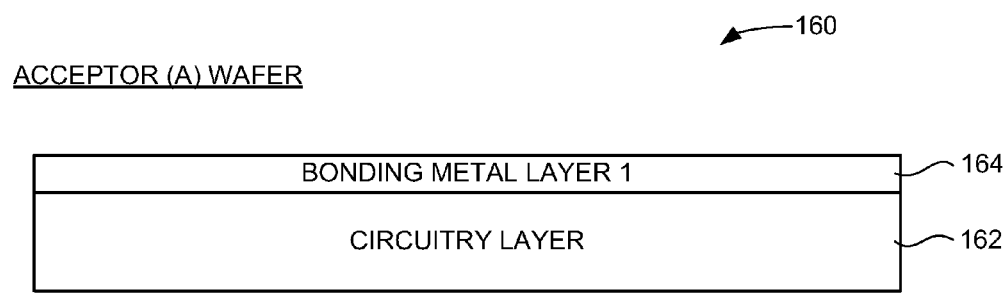
FIG. 5A shows an acceptor wafer constructed in accordance with some embodiments.
Figure 5B:
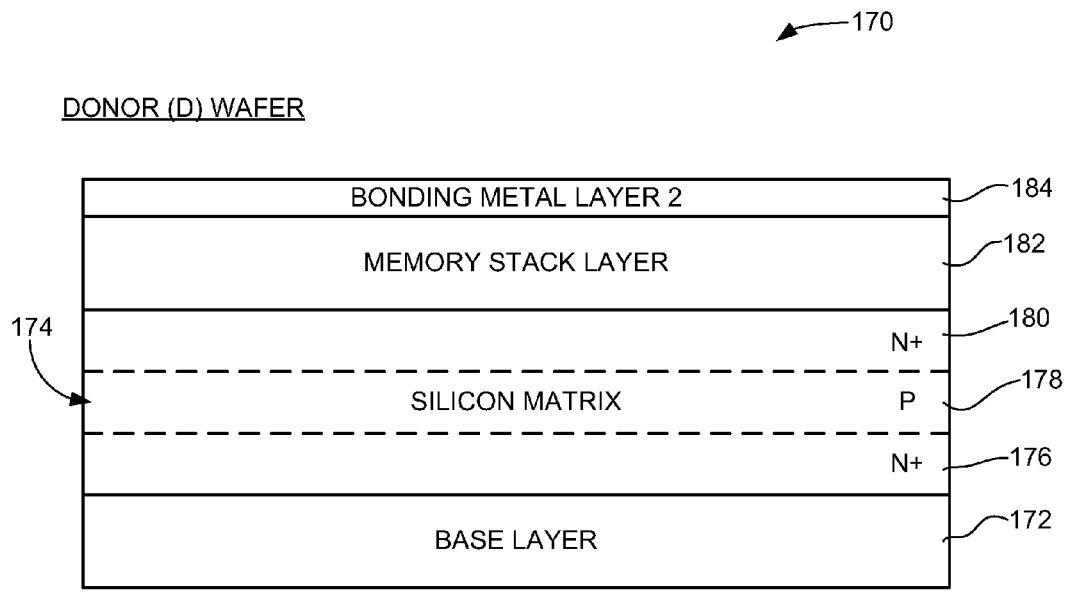
FIG. 5B shows a donor wafer constructed in accordance with some embodiments.

Accordingly, various embodiments of the present invention are generally directed to a manufacturing process that efficiently and easily forms bottom-side control lines (e.g., source lines) for an array of vertically stacked memory cells. To illustrate such processing, reference is first made to FIGS. 5A and 5B which respectively show an acceptor (A) wafer 160 and a donor (D) wafer 170. In some embodiments, the wafers 160, 170 are silicon based substrates which are separately formed with a number of initial, respective features.

The acceptor wafer 160 includes a circuit layer 162 in which various control circuits, including CMOS circuitry, are formed during prior processing. This circuitry may include the various drivers shown in FIG. 3, as well as other control circuitry used in conjunction with the cells 110. The circuit layer 162 may also include contacts for the various vertical transistors. A first conductive metal layer 164 is formed on a top facing surface of the circuit layer 162. The metal layer 164 can be formed of any suitable metals or metal alloys. As desired, the metal layer can include multiple layers of conductive and dielectric materials, and provides a relatively low resistance per unit length.

The donor wafer 170 includes a number of layers including a base layer 172, which may be a bulk oxide. A doped silicon matrix 174 is formed in the base layer, and includes regions 176, 178 and 180 of respective NPN doping levels to ultimately form the respective drain, source and channel regions 122, 124 and 126 in FIG. 3. The doped regions can be formed using ion implantation or other techniques.

A memory element layer 182 is provided on the silicon matrix 174, and includes a number of layers to form a memory element such as the layers 132, 134 and 136 in FIG. 3. As will be appreciated, the particular format of the memory layer 182 will depend on the style of memory element 114 to be used in the completed memory cells 110. A second conductive metal layer 184 is formed on a top facing surface of the memory layer 182. The material composition of the second metal layer 184 may be the same, or different from, the first metal layer 164.

Figure 6:
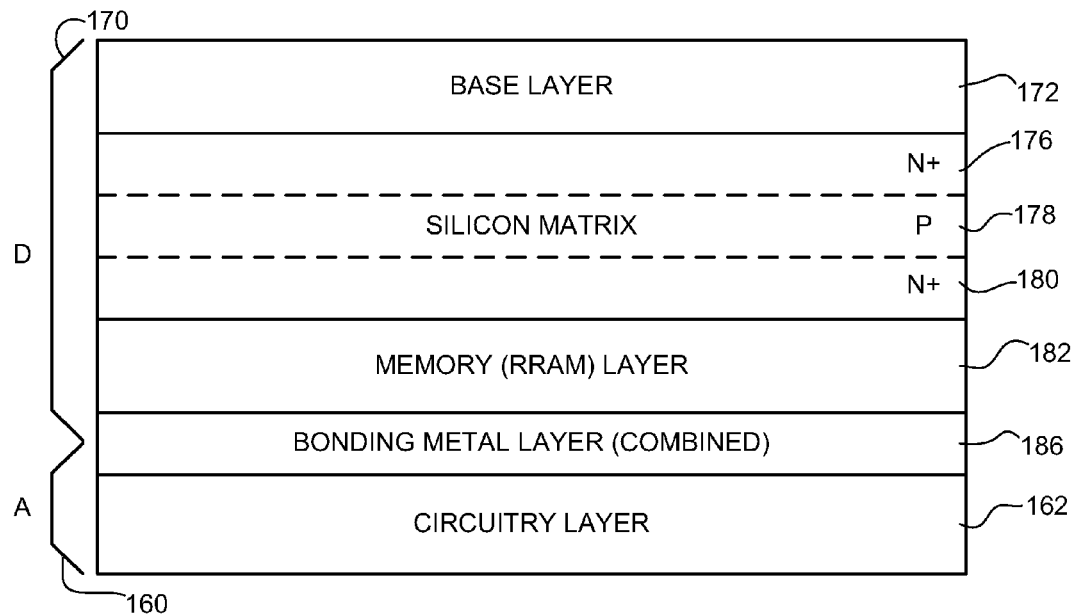
FIG. 6 shows a multi-wafer structure formed by attachment of respective conductive layers of the acceptor and donor wafers of FIGS. 5A-5B to form a combined conductive wafer embedded within the multi-wafer structure.

The respective wafers 160, 170 are mated as shown in FIG. 6 to form a multi-wafer structure. The donor wafer 170 is inverted relative to the acceptor wafer 160 and the first and second metal layers 164, 184 are bonded together to provide a combined metal layer 186. Any number of suitable bonding processes can be utilized, including reflow heating. Additional materials can be introduced to establish the metalized layer 186 interconnection during the bonding process.

As will become apparent from the following discussion, the individual control (source lines) are eventually formed from this metal layer 186, so the metal layer can be characterized as a planar extent of conductive material with a substantially uniform thickness and overall length and width dimensions substantially corresponding to the overall length and width dimensions of the multi-wafer structure. In this way, the finished control lines will fully extend across the array in parallel, spaced apart fashion in the desired direction (e.g., in the row direction or the column direction, as required).

Figure 7A:
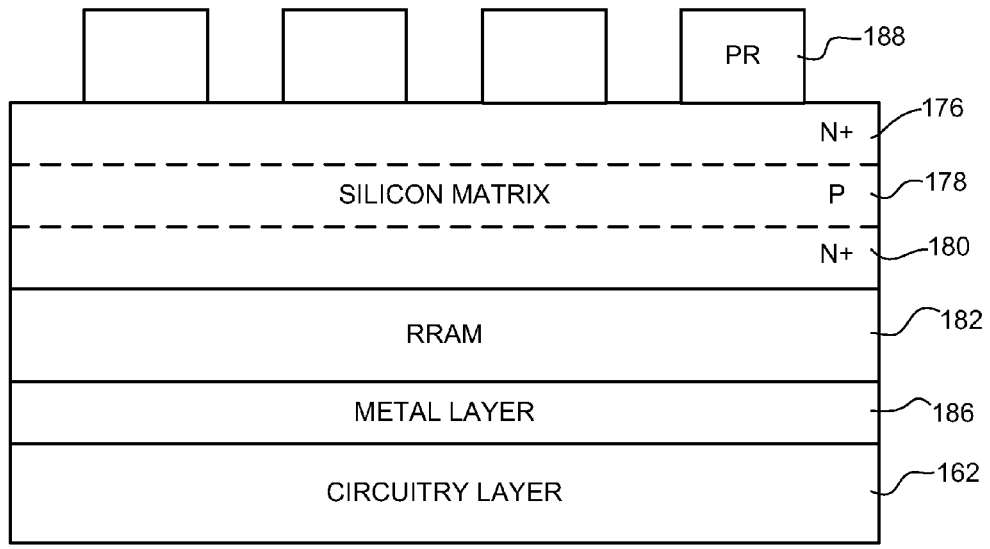
FIGS. 7A-7B provide respective side elevational and top plan views of the structure of FIG. 6 to which dots of photoresist (PR) material have been applied.
Figure 7B:
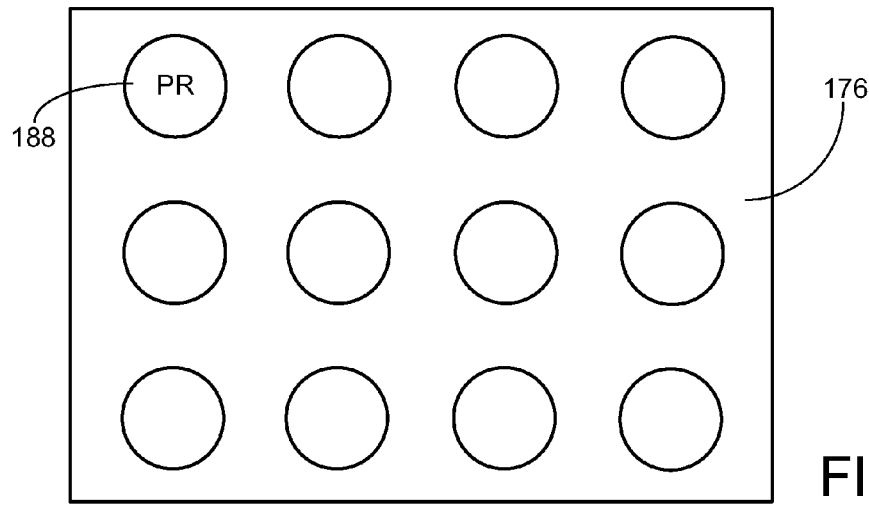
Figure 8:
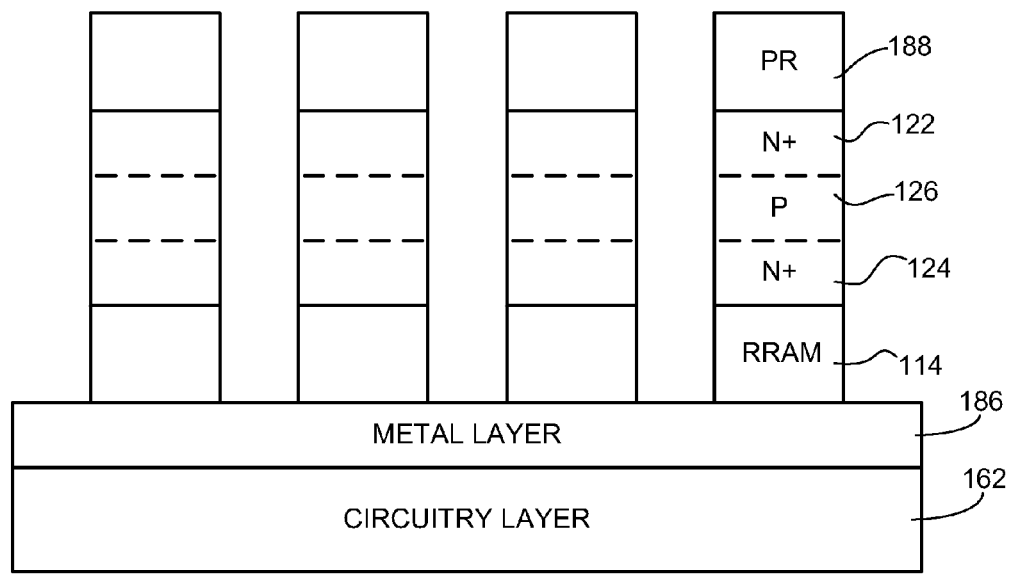
FIG. 8 represents application of an etching process to the structure of FIGS. 7A-7B to form a plurality of spaced apart stacked pillars of semiconductor material arranged into rows and columns.

The base oxide layer 172 is removed and localized areas (dots) of photoresist (PR) 188 are applied to the top of the silicon matrix, as shown in FIGS. 7A-7B. The dots of PR 188 are circular in shape in the illustrated embodiment to provide a cylindrical cross-sectional shape for the cells, although other cross-sectional shapes can be alternatively provided. An etching process is next carried as set forth by FIG. 8, which removes all of the material not covered by the dots of PR 188 down to the metal layer 186. At the end of this etching process, spaced apart pillars, or vertical stacks, of layers will be left which correspond to the individual memory cells as set forth in FIG. 3.

Figure 9A:
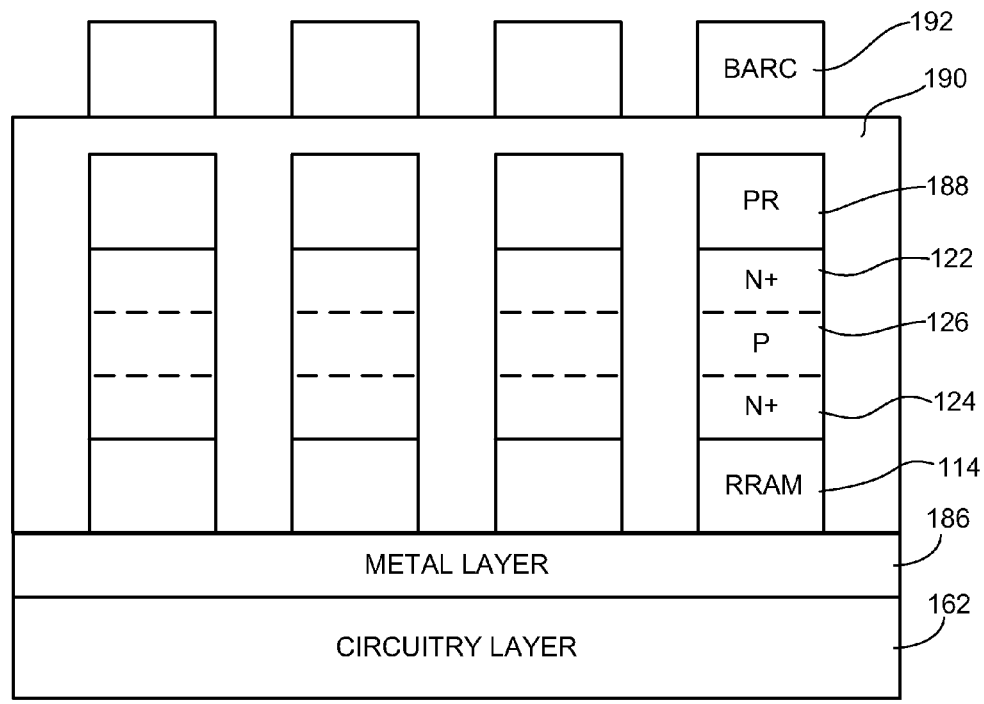
FIGS. 9A-9B illustrate respective side elevation and top plan views of the application of masking material to form embedded control lines from the combined conductive layer within the structure.
Figure 9B:
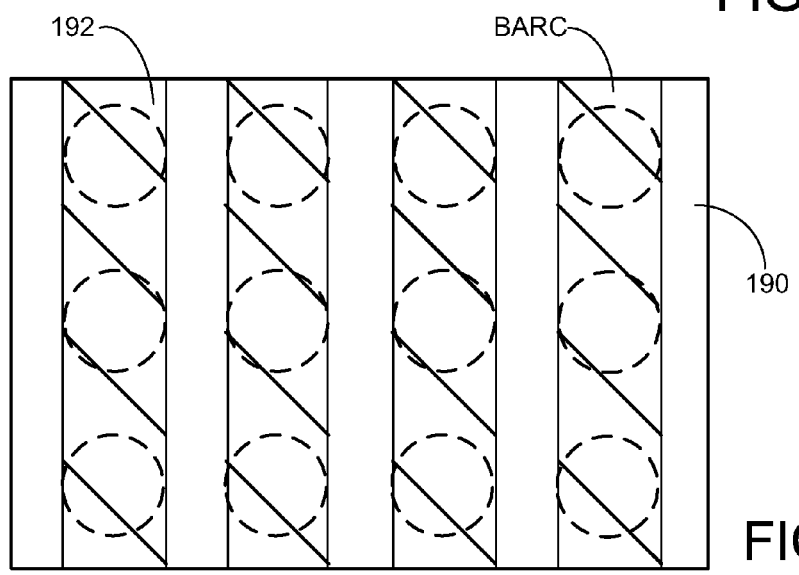

A hard mask is applied as shown in FIGS. 9A-9B to form the individual control (source) lines. Organic material 190 is deposited between the layers and, as desired, a bottom anti-reflective coating (BARC) or other photolithography masking material 192 can be applied to aid the process. The masking material 192 extends across the top of the organic material 190 over the respective stacks as depicted in cross-hatched fashion in FIG. 9B.

Figure 10:
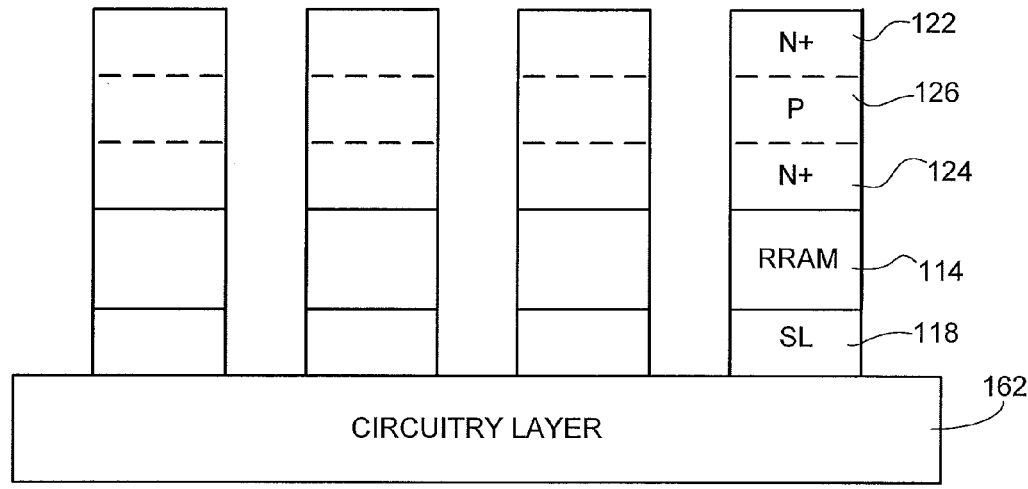
FIG. 10 shows an elevational view of the resulting plurality of embedded control lines formed using the masking material of FIGS. 9A-9B.

An etching process is carried out in FIG. 10 to form the source lines 118. The etching removes the organic material and portions of the conductive layer 186 down to the underlying circuitry layer 162, so that the resulting source lines run under the columns of stacks as shown in FIG. 9B. The photoresist PR 188, organic material 190 and masking material 192 on the top of each stack are also removed at this point.

Figure 10A:
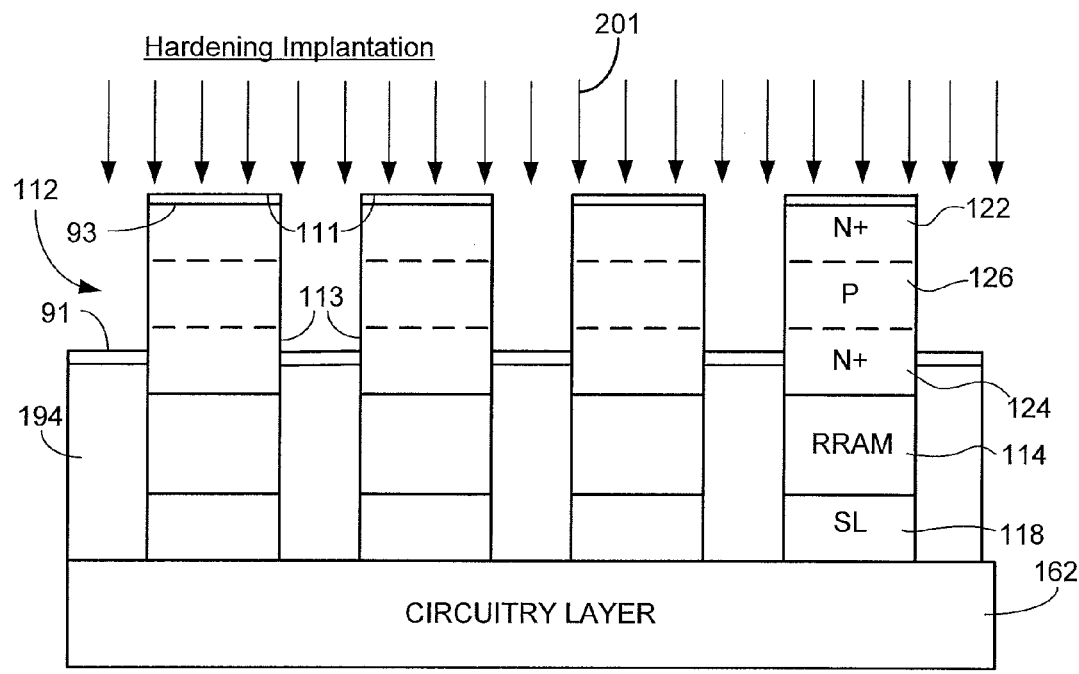
FIG. 10A illustrates a side elevation view of a hardening implantation step.
Figure 10B:
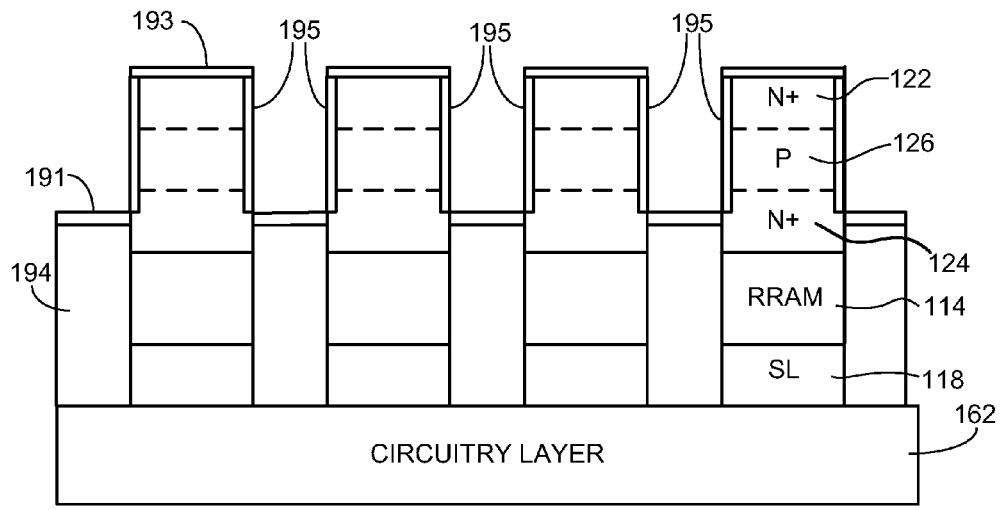
FIG. 10B illustrates a side elevation view of a sacrificial oxide formation step.
Figure 10C:
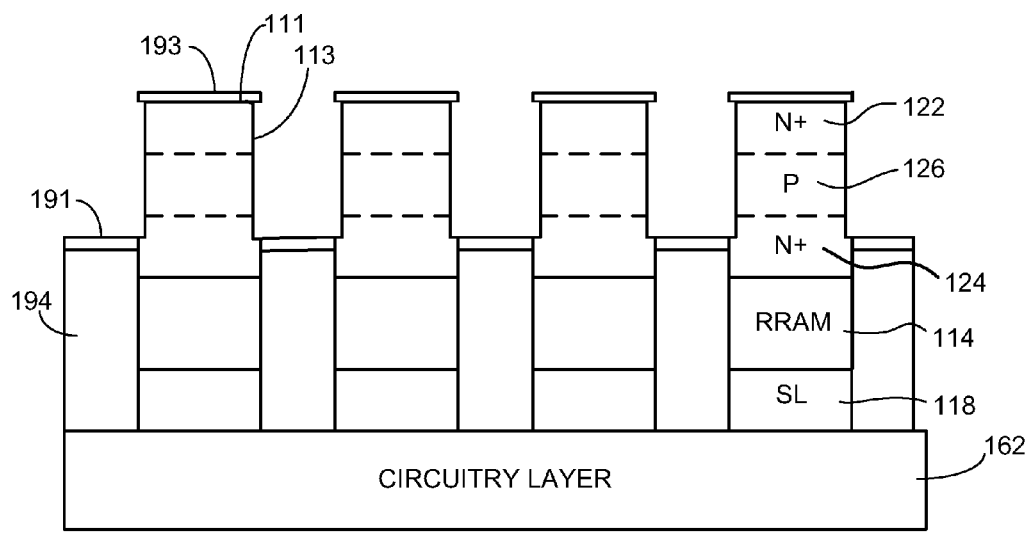
FIG. 10C illustrates a side elevation view of a selective oxide etch step.
Figure 10D:
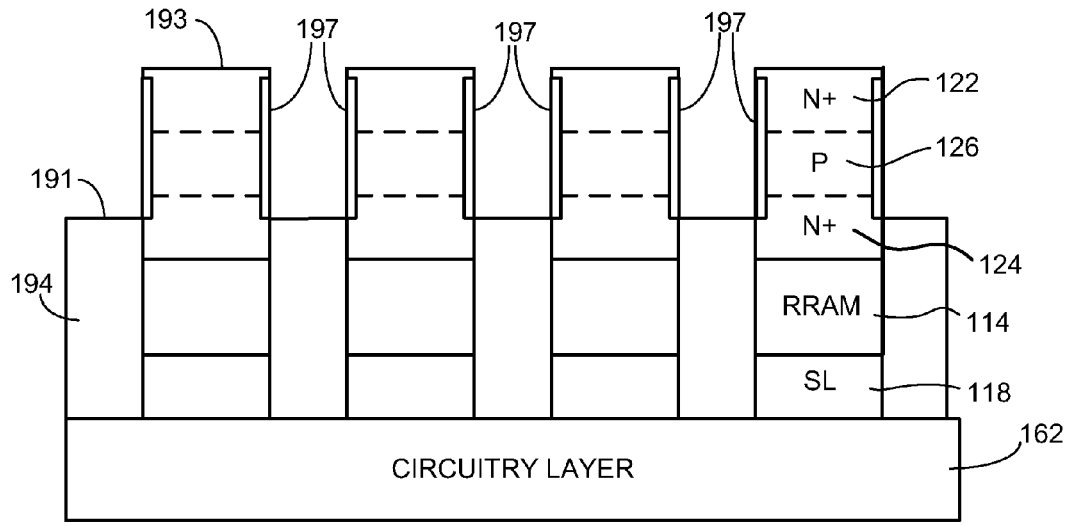
FIG. 10D illustrates a side elevation view of a gate oxide formation step.

FIG. 10A illustrates a side elevation view of a hardening implantation step. FIG. 10B illustrates a side elevation view of a sacrificial oxide formation step. FIG. 10C illustrates a side elevation view of a selective oxide etch step. FIG. 10D illustrates a side elevation view of a gate oxide formation step. These steps allow the preferential rounding of the vertical pillar transistor side surfaces while maintaining a sharp edge with the vertical pillar top surface. These features improve the performance of the vertical pillar transistor.

An underlying dielectric material, such as an oxide 194, is deposited around the bases of the stacks or plurality of pillar structures up to the desired height. The plurality of pillar structures extends orthogonally from the semiconductor wafer or circuitry layer 162.

Each pillar structure will form a vertical pillar transistor 112 having a top surface 111 and a side surface 113 orthogonal to the top surface. The top surface 111 is generally planar and parallel with the major surface of the semiconductor wafer or circuitry layer 162. In many embodiments the cross-sectional or top view shape of the pillar structure includes sharp angles where the sides surfaces of the pillar structure intersect. These sharp angles can decrease the performance of the formed vertical pillar transistor 112. Thus rounding these sharp edges or corners is desired.

One illustrative method of rounding these sharp edges or corners of the side surfaces of the pillar structure is to implant a hardening species into the vertical pillar transistor top surface and not in the vertical pillar transistor side surface(s). The hardening implant step implants a particular ion (e.g., nitrogen) into the semiconductor material surface (e.g., silicon) so that when that implanted semiconductor material surface is oxidized, it forms an oxide that includes the implanted ion (e.g, silicon oxynitride). The remaining non-implanted surfaces will form a different oxide species upon the oxidation step. Then the two different oxide layers can be preferentially removed utilizing an appropriately oxide selective removal or etching step.

As illustrated in FIG. 10A, a hardening implantation 201 directs an implantation ion into the vertical pillar top surfaces 111 and the parallel exposed oxide 194 surfaces that was deposited up to a desired height of the vertical pillars. The implantation step forms ion (e.g., nitrogen) implanted surfaces 93 and 91 that will form a first oxide layer (e.g., silicon oxynitride) upon oxidation.

FIG. 10B illustrates the formation of the sacrificial oxide formation. The vertical pillar transistor is oxidized to form a top surface oxide material layer 193 and a side surface oxide material layer 195. The top surfaces oxide material layer 193 is different than the side surface oxide material layer 195 due to the hardening implantation step.

FIG. 10C illustrates a side elevation view of a selective oxide etch step. The selective etch step preferentially removes the side surface oxide layer 195 to form a vertical pillar transistor having rounded side surfaces. For example, if the hardening implantation ion is nitrogen, the oxidation step will form a silicon oxynitride layer 193, 191 on the top surfaces 111 and a silicon oxide layer 195 on the sides surfaces 113. The silicon oxide layer 195 on the sides surfaces 113 can be selectively etched relative to the silicon oxynitride layer 193, 191 on the top surfaces 111. The oxide formation and selective etching of the sides surfaces 113 functions to round out the side surfaces 113 of the vertical pillar while the corner or edge where the top surface 111 meets the side surface 113 remains a sharp or non-rounded intersection of the two surfaces 111 and 113.

FIG. 10D illustrates a side elevation view of a gate oxide formation step. A gate oxide layer 197 can then be formed on the rounded side surfaces 113 of the vertical pillar. Forming the gate oxide layer 197 can further enhance the rounding of the side surfaces 113 of the vertical pillar forming a rounded gate oxide surfaces of the vertical pillar structure.

Figure 11A:
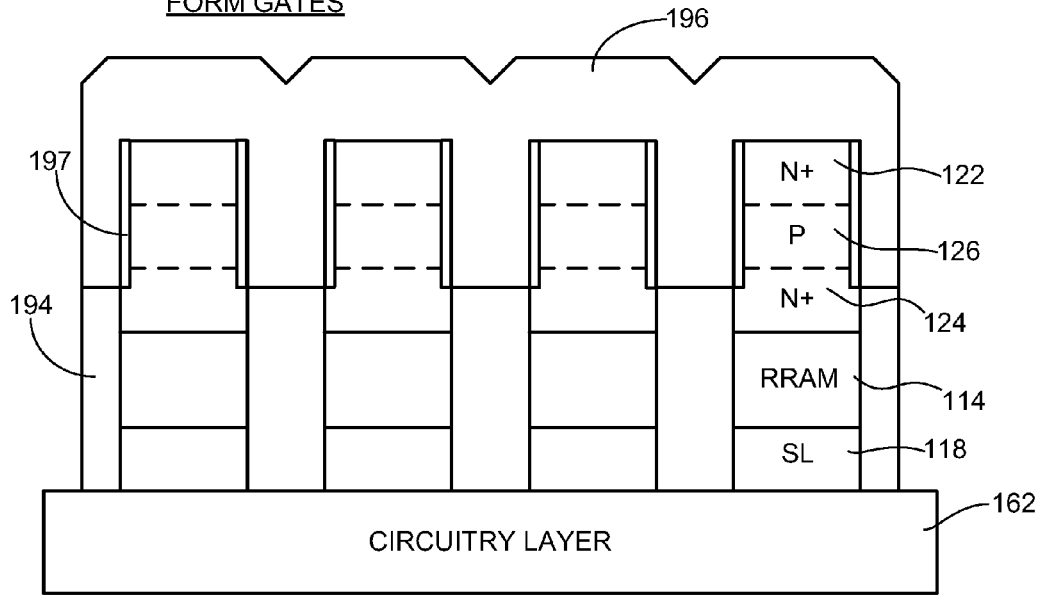
FIGS. 11A-11D show a sequence in which gate structures are formed.
Figure 11B:
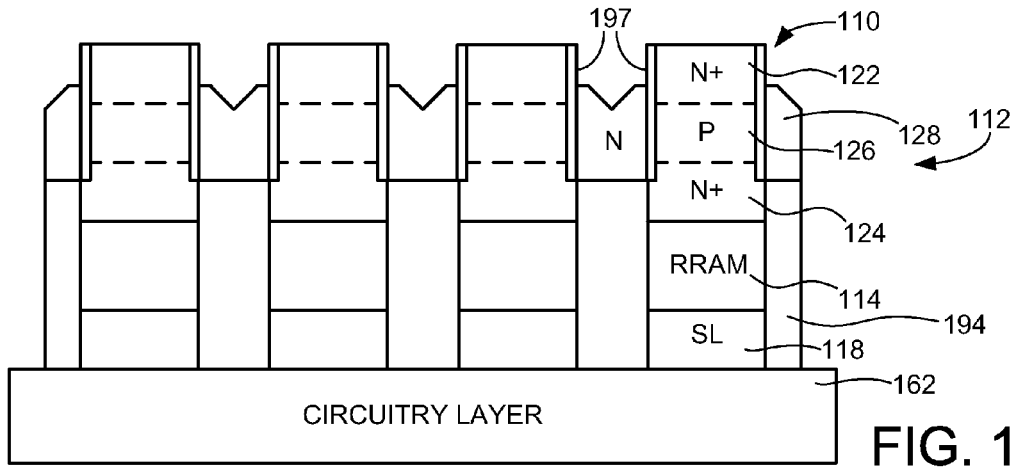
Figure 11C:
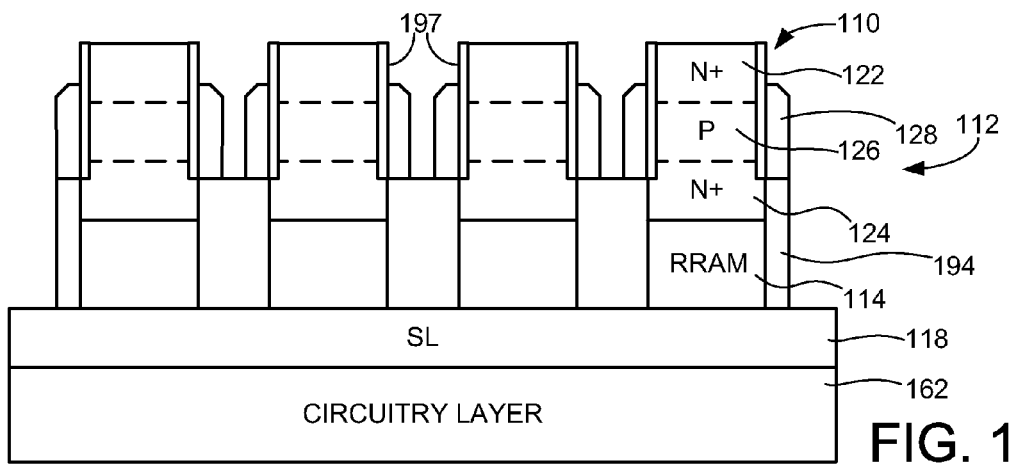
Figure 11D:
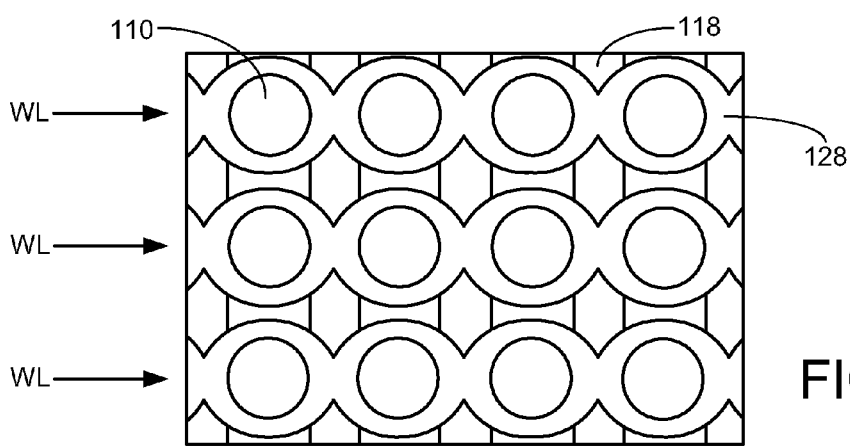

FIGS. 11A-11D show a sequence in which gate structures are formed on the rounded gate oxide surfaces of the vertical pillar structure. An appropriate semiconductor gate material 196 such as silicon is deposited on top of the oxide 194 to fully enclose the stacks or vertical pillar structures, as shown in FIG. 11A. The semiconductor material can be doped via ion implantation at this time. A suitable masking and etching process removes the semiconductor material down to form the gate structures as generally depicted at 128 in FIG. 3. FIG. 11B shows a row of the cells; FIG. 11C shows a column of the cells; and FIG. 11D shows a top plan representation of the cells. As can be seen from these drawings, the gate structures 128 are interconnected along each row to form the aforementioned word lines 120, and the gate structures of each selected row are electrically isolated from those of the adjacent rows.

Figure 12A:
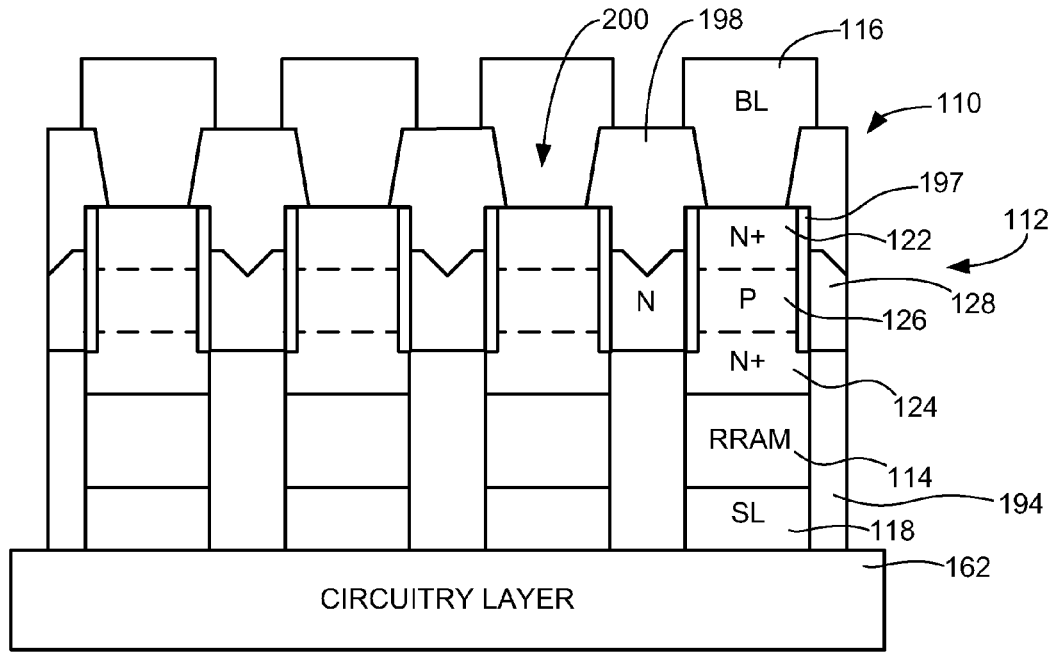
FIGS. 12A-12B illustrate subsequent formation of spaced apart bit lines across the top side of the pillars of semiconductor material.
Figure 12B:
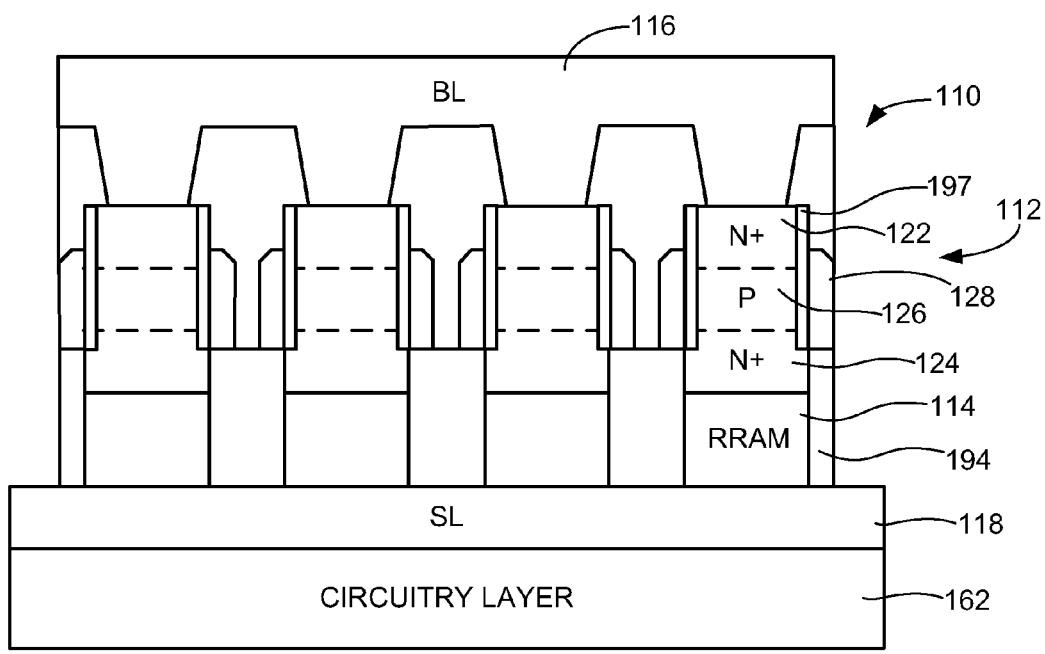

Top side bit lines (116 in FIGS. 2-3) are next formed in FIGS. 12A-12B. In some embodiments, a layer of oxide 198 or other dielectric is deposited onto the memory cells as shown in FIG. 12A. This oxide 198 fills the areas between adjacent gate structures 126 and forms a uniformly thick layer above the top elevation of the cells. Vias 200 are formed in this oxide layer and filled with conductive material using a physical vapor deposition or other suitable process.

The deposited material forms a layer of uniform thickness that covers the length and width dimensions of the overall array. Suitable masking and etching processing (not separately depicted) removes portions of this material to form the parallel, spaced apart bit lines 116 as shown. FIG. 12A shows the completed memory cells 110 along a selected row, and FIG. 12B shows the completed memory cells along a selected column. It will be noted that in this embodiment the bit lines 116 and source lines 118 are parallel and orthogonal to the word lines 120, corresponding to the schematic depiction of FIG. 2. The processing disclosed herein can provide other arrangements and orientations of these respective control lines as required.

Figure 13A:
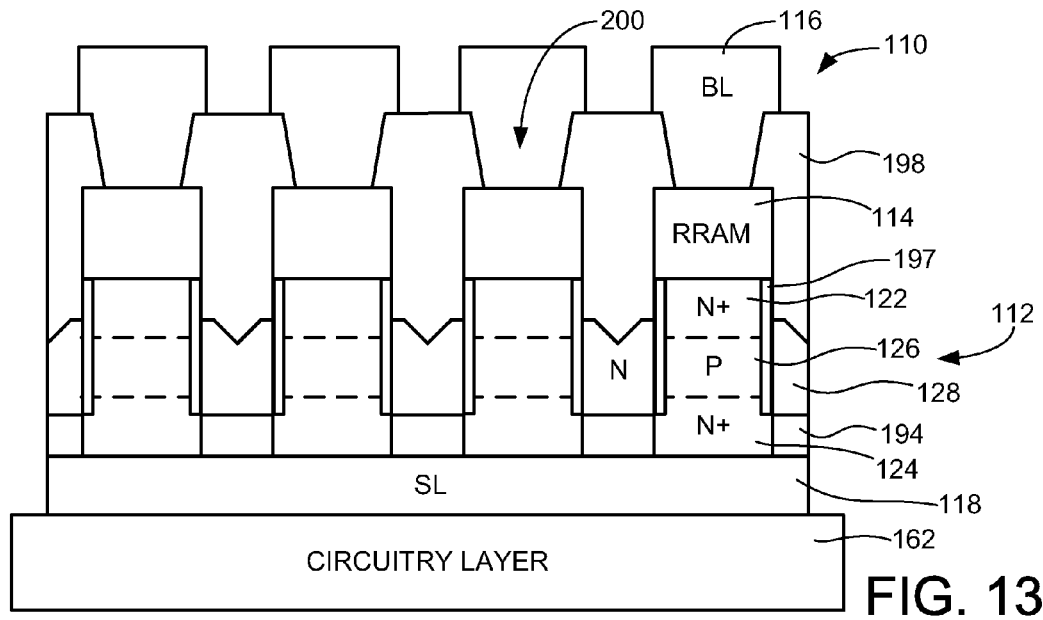
FIGS. 13A-13B provide an alternative configuration for the multi-wafer structure in accordance with various embodiments.
Figure 13B:
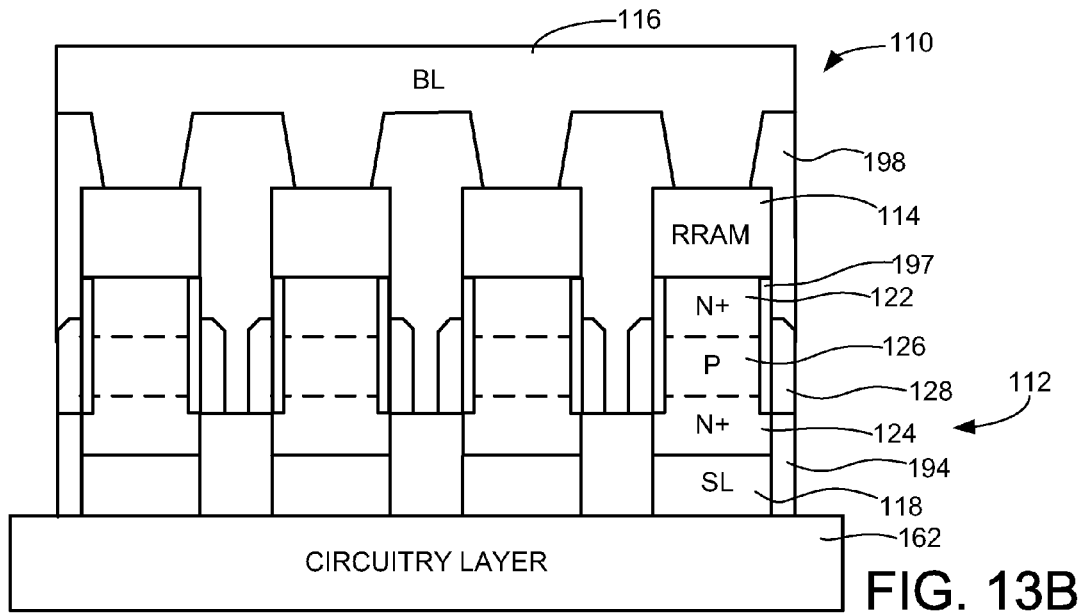

FIGS. 13A and 13B show an alternative operation of the foregoing process to provide an array with memory cells 110A. As before, FIG. 13A shows a row of cells and FIG. 13B shows a column of cells. The memory cells 110A are similar to the memory cells 110 except that the memory element 114 is located above the switching device 112 in FIGS. 13A-13B. These figures also show an alternative orientation of the source lines 116, which are orthogonal to the bit lines 118 and parallel with the word lines 120. That is, both the source lines 118 and the word lines 120 are connected along each row in the array.

It will now be appreciated that the various embodiments as presented herein provide a number of advantages over the prior art. Spaced apart bottom side control lines can be easily and efficiently formed during manufacturing, eliminating the need for additional interconnections and conductive layers. Unlike top side interconnection techniques, the present process allows the source lines to run independently of the bit lines. Enhanced data densities can be achieved and multiple concurrent access operations can be carried out on different parts of the array, as desired.

Thus, embodiments of the VERTICAL TRANSISTOR WITH HARDENING IMPLATATION are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method comprising:
   providing a semiconductor wafer having a plurality of pillar structures extending orthogonally from the semiconductor wafer, each pillar structure forming a vertical pillar transistor having a top surface and a side surface orthogonal to the top surface;
   implanting an ion species into the vertical pillar transistor top surface;
   oxidizing the vertical pillar transistor forming a top surface oxide material layer and a side surface oxide material layer, wherein the top surface oxide material layer is formed of a different oxide species than the side surface oxide material layer; and
   removing selectively the side surface oxide material layer to expose the side surface comprising a rounded side surface and not removing the top surface oxide material layer.

2. The method according to claim 1 wherein the ion species is nitrogen.

3. The method according to claim 1 wherein the top surface is a parallel with a major surface of the semiconductor wafer.

4. The method according to claim 1 wherein the top surface and the rounded side surface form a 90 degree angle.

5. The method according to claim 1 further comprising a memory cell in electrical connection with the vertical pillar transistor.

6. The method according to claim 5 wherein the memory cell comprises a spin-torque transfer memory cell.

7. The method according to claim 5 wherein the memory cell comprise an array of memory cells.

8. The method according to claim 1 further comprising forming a gate oxide layer on the rounded side surface.

9. A method comprising:
   providing a semiconductor wafer having a plurality of pillar structures extending orthogonally from the semiconductor wafer, each pillar structure forming a vertical pillar transistor having a top surface and a side surface orthogonal to the top surface, the vertical pillar transistor having a drain, source and channel regions vertically stacked on top of each other and extending away from the semiconductor wafer;
   implanting an ion species into the vertical pillar transistor top surface and not into the vertical pillar transistor side surface;
   oxidizing the vertical pillar transistor forming a top surfaces oxide material layer and a side surface oxide material layer, wherein the top surfaces oxide material layer is formed of a different oxide species than the side surface oxide material layer;
   removing selectively the side surface oxide material layer to expose the side surface comprising a rounded side surface and not removing the top surface oxide material layer; and
   electrically coupling a memory cell with the vertical pillar transistor.

10. The method according to claim 9 wherein the vertical pillar transistor separates the memory cell from the semiconductor wafer.

* * * * *